United States Patent
Herrera

(10) Patent No.: US 6,525,574 B1
(45) Date of Patent: Feb. 25, 2003

(54) GATE BOOTSTRAPPED CMOS SAMPLE-AND-HOLD CIRCUIT

(75) Inventor: Ruben Herrera, Short Hills, NJ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/947,989

(22) Filed: Sep. 6, 2001

(51) Int. Cl.[7] ................................................ G11C 27/02
(52) U.S. Cl. ........................................ 327/94; 327/589
(58) Field of Search ............................. 327/91, 93, 94, 327/589; 341/122

(56) References Cited

U.S. PATENT DOCUMENTS

| | | | |
|---|---|---|---|
| 5,084,634 A | * | 1/1992 | Gorecki ..................... 327/362 |
| 5,945,872 A | * | 8/1999 | Robertson et al. .......... 327/390 |
| 6,052,000 A | * | 4/2000 | Nagaraj ...................... 327/91 |
| 6,060,914 A | * | 5/2000 | Nunokawa .................. 327/309 |
| 6,215,348 B1 | * | 4/2001 | Steensgaard-Madsen .... 327/390 |
| 6,310,565 B1 | * | 10/2001 | Ong et al. .................... 327/91 |
| 6,323,697 B1 | * | 11/2001 | Pavan .......................... 327/91 |

* cited by examiner

Primary Examiner—My-Trang Nuton
(74) Attorney, Agent, or Firm—W. Daniel Swayze, Jr.; W. James Brady; Frederick J. Telecky, Jr.

(57) ABSTRACT

A sample and hold circuit to sample and hold a signal, includes a load capacitor to hold the signal, a switch to control the charging of said load capacitor, and a boost circuit to control the operation of said switch. The boost circuit is directly connected to the switch without another switch between the boost circuit and the switch.

7 Claims, 3 Drawing Sheets

A: (300M −69.201)

GATE BOOTSTRAPPED CMOS SAMPLE-AND-HOLD CIRCUIT

FIELD OF THE INVENTION

This invention relates generally to electronic circuits and more specifically to a low distortion and high speed, sample and hold circuit.

BACKGROUND OF THE INVENTION

A sample and hold circuit is a circuit that monitors a signal provides its value at predetermined times, and keeping it constant thereafter.

A sample and hold circuit with boosted clock is shown in FIG. 1. This sample and hold circuit includes a switch 100 coupled to a load capacitor 110. The load capacitor 110 holds the input voltage $V_{IN}$ at predetermined times which are controlled by the switch 100. The control of switch 100 is determined by the voltage on the gate of switch 100.

To have the highest transfer of voltage from $V_{IN}$ to the load capacitor 110, an n type switch 100 is employed. However because an n type switch is chosen, the substrate is connected to ground when a p-well is not available which causes distortion in the sampled signal.

In FIG. 2a, a replica circuit 130 shown as a NFET acting as a diode is added in the current path with a current source outputting the current $I_{BIAS}$. This generates a voltage $V_{GS2}$ to be placed on the boost capacitor 120. The voltage generated by diode 130 will follow the threshold voltage variations of switch 100, as a result of the fact that diode 130 is a replica of switch 100. As a consequence of the circuit of FIG. 1, the voltage applied to switch 100 will have an additional or boost charge applied to the gate of switch 100 as a result of the voltage across diode 130. Switch 140 and switch 150 both lead to problems during the operation of these switches. If for example, a PMOS switch is used in an n well process, the well of the transistor has to be connected to a voltage higher than a maximum voltage applied to the gate of switch 100. Alternatively, if NMOS switches are used for switches 140 and 150 then the clock signal to control switch 140 and switch 150 has to be boosted. Boosting the clock signal results in an increased amount of circuitry and complexity and consequently is costly in both chip area and production costs. Additionally, the switch 150 is used to turn off switch 100 by connecting the gate of transistor 100 to ground. All these problems create additional constraints on the trade off of speed, precision, and power consumption of the design for the sample and hold circuit. The voltage on switch 140 is equal to voltage $V_{BIAS}+V_{GS2}$ and this causes problems for switch 140 in that once the voltage on the drain of goes above VDD, the switch 140 could close without the clock signal CK2 being applied. This is undesirable.

An additional problem is the size of switch 100. Switch 100 may be implemented by an NFET and at a certain speed, the switch 100 represents a specific on resistance value. With higher speeds, the on resistance value of switch 100 should be lowered. To lower the on resistance, a higher physical size of switch 100 is required. However, increasing the size of switch 100 leads to an increased parasitic capacitance which results from a wider channel. However, this higher capacitance to parasitic slows the response in terms of frequency.

Consequently, it is required to overcome the problem of using the PMOS switch with the n-well process without using the boosted clock signals and overcome the problem of a high-speed operation.

SUMMARY OF THE INVENTION

The present invention provides an increased voltage to the gate of the switch to avoid increasing the size of the switch and effectively lowering the on resistance of the switch. Thus, the speed of the switch and ultimately the speed of the sample and hold circuit is increased.

Advantageously, this higher voltage does not affect the switches controlling the gate of the switch. To control the gate of the switch a boost voltage is applied and this boost voltage does not adversely affect the operations of switches used to produce the boost voltage.

BRIEF DESCRIPTION OF THE DRAWINGS

FIG. 2b illustrates the timing signals for the sample and hold circuit of FIG. 2a;

FIG. 3b illustrates a timing diagram used to control the switches of FIG. 3a; and FIG. 4 illustrates a simulated distortion at the output of the sample and hold circuit of FIG. 3a.

DETAILED DESCRIPTION OF THE DRAWINGS

Various embodiments of the circuit of the present invention is described below in detail. However, it should be appreciated that the present invention provides many applicable inventive concepts which can be embodied in a wide variety of specific contexts. These specific embodiments discussed are merely illustrative of specific ways to make and use the invention and not limit the scope of the invention.

The present invention will be described with reference to a number of specific embodiments. Various ones of these embodiments provide a variety of solutions to the problems outlined above.

Figure 3A:
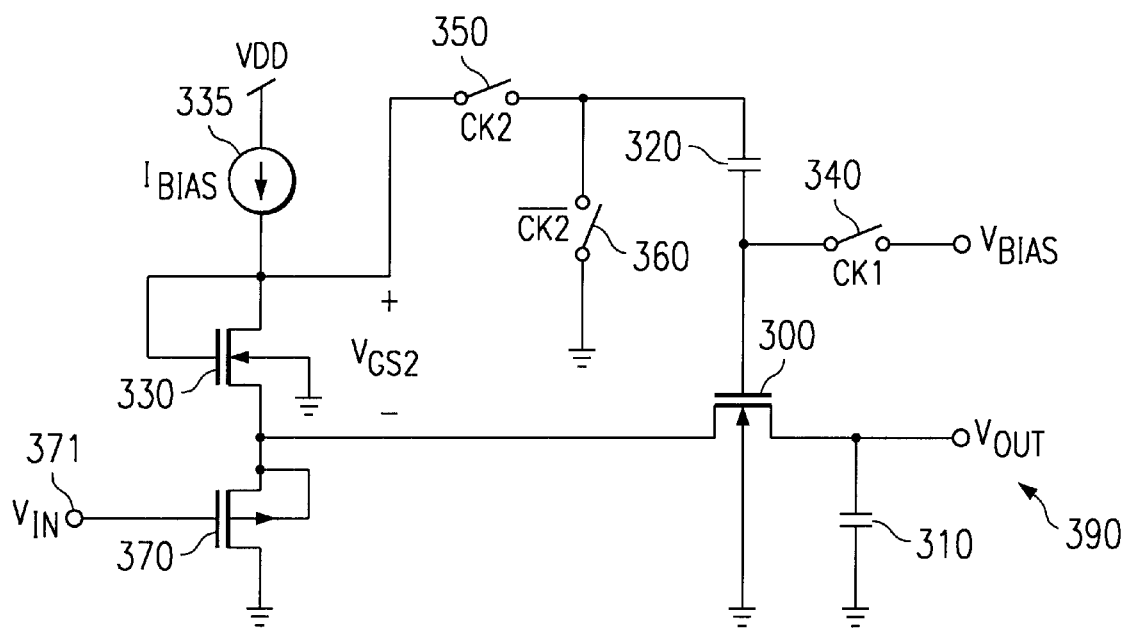
FIG. 3a illustrates a sample and hold circuit of the present invention.

FIG. 3a illustrates a sample and hold circuit 390 of the present invention. As illustrated, a PFET 370 is connected with body connected to source; additionally, the gate is connected to receive the input signal from a terminal 371; the drain of PFET is connected to ground. The source of PFET 370 is connected to the source of NFET 330. The source and drain of PFET 370 is a current path with current source 335. As the input voltage $V_{in}$ increases, the voltage across source to drain of PFET 370 correspondingly increases. The gate of NFET 330 is connected to the drain of NFET 330 and the body is connected to ground to form a diode. As current flows from the drain to the source of NFET 330, a voltage drop $V_{GS2}$ is generated across the drain to source of NFET 330. The drain of NFET 330 is connected to current source 335, and the current source 335 is connected to voltage VDD. The source of NFET 330 and source of PFET 370 is connected to the source of NFET 300. The NFET 330 is a replica of NFET 300 preferably made on the same chip as NFET 300 with the same ratio of source drain length. The size of NFET 300 may be the same or different that the NFET 330. The drain of NFET 330 is connected to switch 350. The switch 350 is constructed to be normally open except during the presence of clock signal CK2. Switch 350 applies the voltage $V_{GS2}$ to boost capacitor 320 to turn on switch 300, The switch 350 is connected to the switch 360, which is normally open and configured to be closed during the absence of clock signal CK2. Switch 360 connects one end of boost capacitor 320 to ground. Both the switches 350 and switch 360 are connected to boost capacitor 320. The boost capacitor 320 is connected to ground through switch 360 and connected to NFET 330 through switch 350. When switch 350 is closed, boost capacitor 320 receives a boost voltage namely the voltage across NFET 330 or diode 330 equal to voltage VS2. Additionally, the other end of capacitor 320 is connected to the gate of NFET 300 to control the operation of NFET 300 by regulating the voltage applied to the gate. The NFET 300 serves as a switch to connect the input voltage $V_{in}$ with the load capacitor 310 during appropriate periods of time when the load capacitor 310 is to be refreshed with the input voltage. Consequently, switch 300 controls the charging of load capacitor 310. This period of time is normally considered the sample time. When the switch 300 is open, the capacitor 310 is charged to and holds the input voltage during the hold period of the sample and hold circuit. Additionally, the gate of NFET 300 is connected to switch 340. The switch 340 connects the voltage $V_{BIAS}$ with the capacitor 320 and switch 300. This voltage $V_{BIAS}$, greater than 0 voltages is typically insufficient to turn on switch 300 and maintains switch 300 in an open position. It charges the boost capacitor 320 to the voltage bias. Additionally, the capacitor 320 will raise the voltage on the gate of switch 300 sufficiently to open the switch 300 when the boost voltage is received from switch 350. Boost capacitor 320 and switch 350 form a boost circuit to control switch 300.

In operation, during the first period of time 380, the clock signal CK1 is high, the clock signal $\overline{CK2}$ is high, and the clock signal CK2 is low. The switch 340 closes to charge the boost capacitor 320 and the gate 300 to voltage $V_{BIAS}$. The voltage $V_{BIAS}$ is sufficiently low to turn off the switch 300. During this period of time, the switch 350 will be off and switch 360 will be on.

Figure 1A:
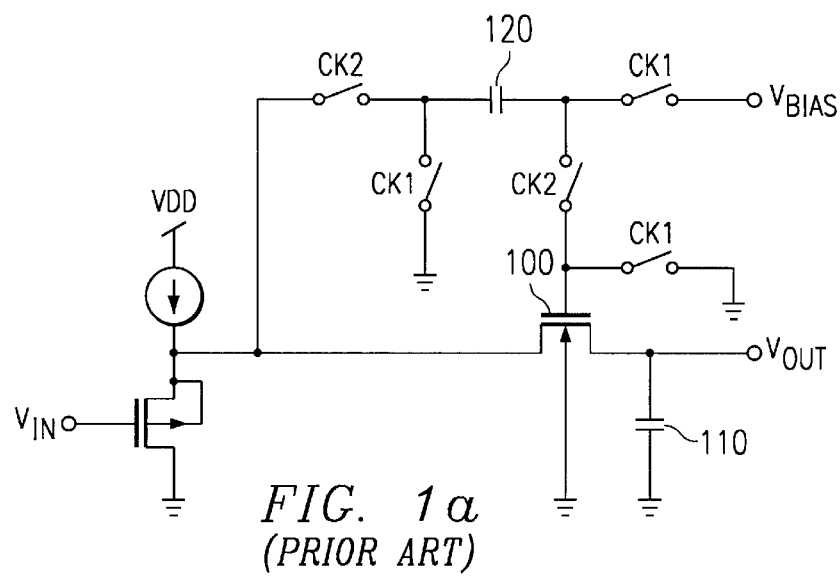
FIG. 1a illustrates, a sample and hold circuit.
Figure 1B:
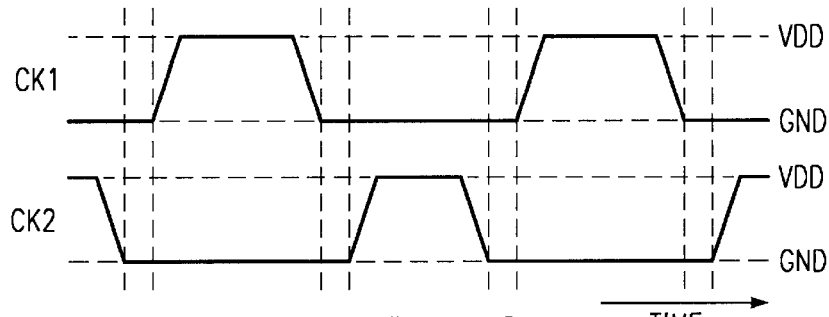
FIG. 1b illustrates timing diagram for the switches of FIG. 1.
Figure 2A:
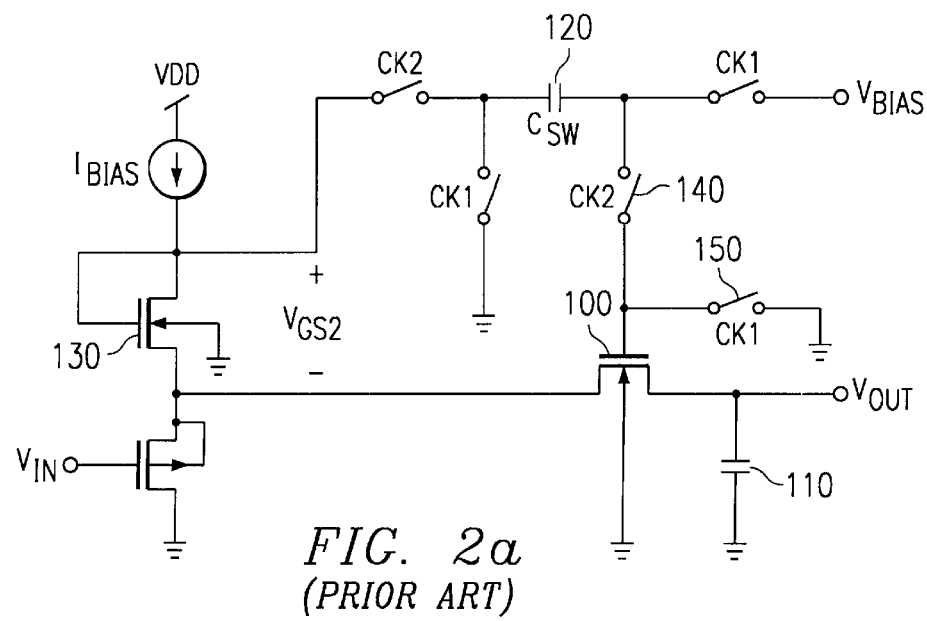
FIG. 2a illustrates another sample and hold circuit.
Figure 2B:
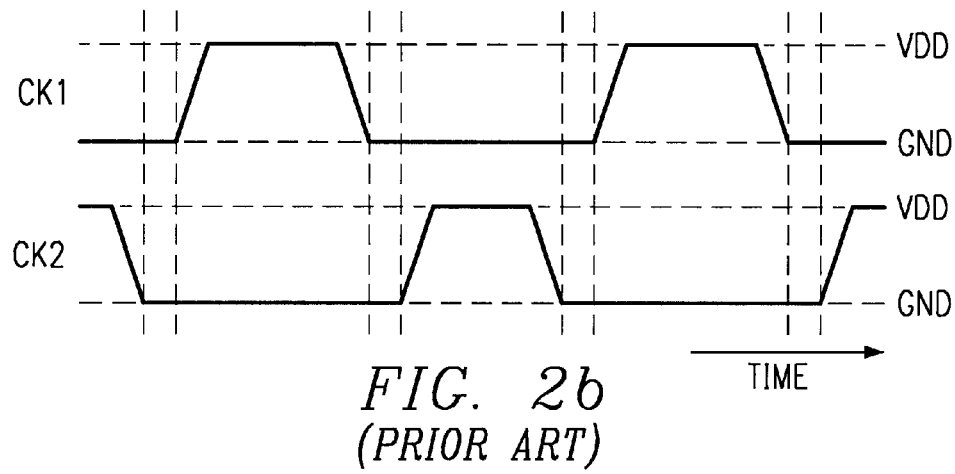
Figure 3B:
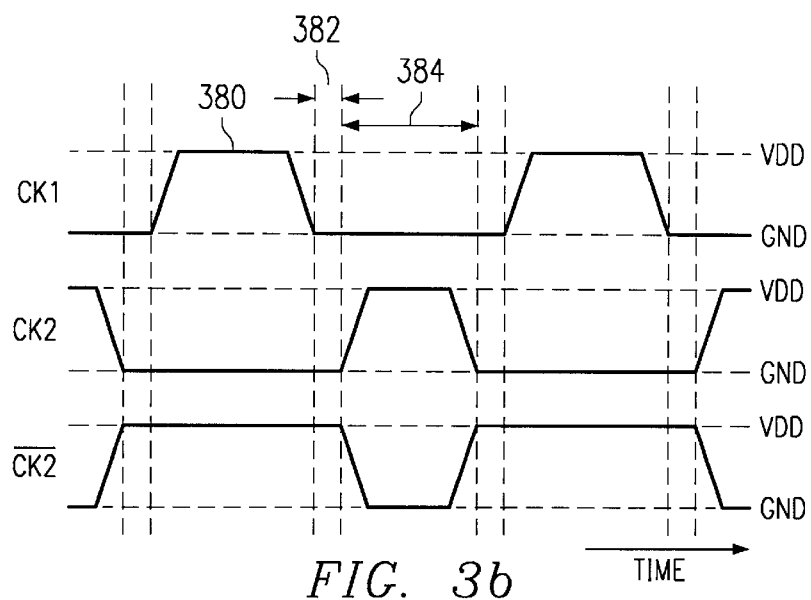

During a second period of time 382, CK1 is off, $\overline{CK2}$ is high, and CK2 is low. Thus, the switch 360 is closed and switch 340 is open. During the third period of time 384, clock signal CK1 is low, clock signal $\overline{CK2}$ is low, and clock signal CK2 is high. Switch 350 is closed and switches 360 and 340 are open. The voltage across NFET 330 is applied to boost capacitor 320 to provide a higher voltage to the gate of or boost the voltage to capacitor 330. This voltage on capacitor 320 as a result of the boost voltage is sufficiently high to turn on switch 300 which allows the input signal on terminal 371 to be transferred across load capacitor 310 during the sample period of the sample on hold circuit 390. Comparing FIG. 3 with either FIG. 1 or FIG. 2, two switches have been eliminated namely the switch between the boost capacitor and the gate of NFET 300 and the switch between the gate of NFET 300 and ground. Additionally, boosted clock signals are not needed with the sample and hold circuit 390 of the present invention. The diode 330 compensates for variations of the threshold voltage on the switch 300 and the effective on resistance of the sampling switch 300 is kept substantially constant, minimizing distortion of the sample signal, as illustrated as signal $V_{in}$. By implementation of the boost voltage to switch 300, the physical size of switch 300 is reduced. Additionally, since there is no switch for connection between the a capacitor 320 and the gate of circuit 300, high voltages and the false triggering of the switch are avoided.

Figure 4:
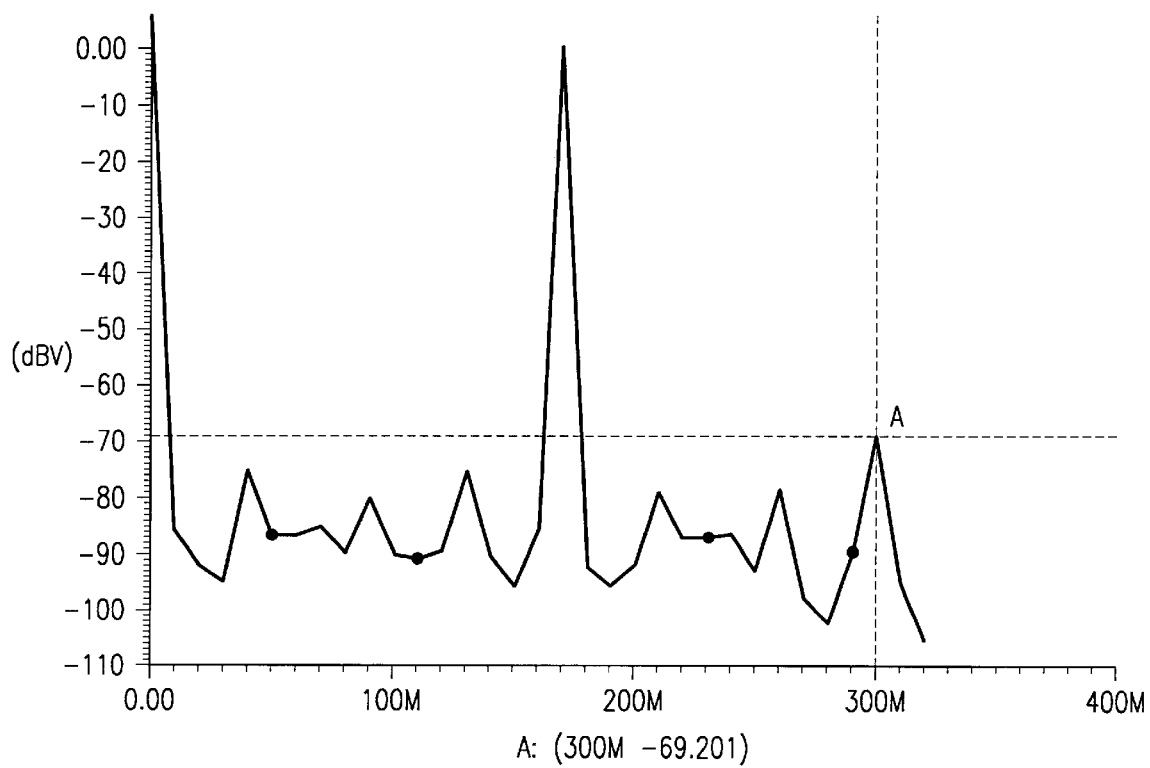

FIG. 4 illustrates a simulation of the circuit of FIG. 3a implemented in 1833c05 TI CMOS technology. The circuit operates at 640 Msps with 1.2 Vpp sinusoidal inputs at 170 MHz, and the signal is held on the capacitance of 200 fF. The plot shows a second harmonic of −69 dB with the respect to the fundamental at the input frequency being equivalent to 10 bits of resolution.

The load capacitor 310 and boost capacitor 320 are preferably an integrated circuit capacitor. This element could be formed from two conductors separated by dielectric material. As an example, one or both of the conductors might be polysilicon and another conductive material. One plate could be the transistor body. The dielectric material might be oxide (e.g. $S_iO_2$), a nitride, e.g. $Si_3N_4$ or combinations of oxides and nitrides for example, ON, ONO, oxy-nitride. Other materials could additionally be utilized.

What is claimed is:

1. A sample and hold circuit to sample and hold an input signal, comprising:

a load capacitor to hold the input signal;

a switch to control the charging of said load capacitor; and a boost circuit to boost said input signal and to control the operation of said switch:

wherein said boost circuit is directly connected to said switch without another switch between said boost circuit and said switch.

2. A sample and hold circuit as in claim 1, wherein said switch is a NFET including a gate.

3. A sample and hold circuit as in claim 2, wherein said gate is turned off by a bias voltage greater than zero volts.

4. A sample and hold circuit as in claim 2, wherein said switch is controlled by maintaining a positive voltage on said gate.

5. A sample and hold circuit as in claim 1, wherein said boost circuit includes a boost capacitor.

6. A sample and hold circuit as in claim 5, wherein said boost capacitor is switched to ground before a bias voltage is applied to said boost capacitor.

7. A sample and hold circuit as in claim 5, wherein said boost capacitor receives a boost voltage from a voltage across a diode.

* * * * *